Figures 1, 2:
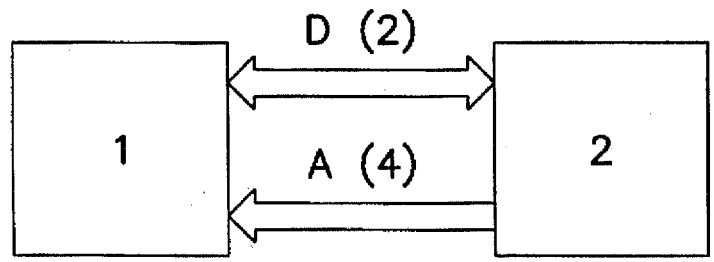

United States Patent
Kolbinger

[11] Patent Number: 5,663,964
[45] Date of Patent: Sep. 2, 1997

[54] METHOD FOR TESTING DIGITAL MEMORY DEVICES

[75] Inventor: Josef Kolbinger, Ergoldsbach, Germany

[73] Assignee: Siemens Aktiengesellschaft, München, Germany

[21] Appl. No.: 676,335
[22] PCT Filed: Jan. 18, 1995
[86] PCT No.: PCT/DE95/00100
   § 371 Date: Oct. 10, 1996
   § 102(e) Date: Oct. 10, 1996
[87] PCT Pub. No.: WO95/20226
   PCT Pub. Date: Jul. 27, 1995

[30] Foreign Application Priority Data

Jan. 21, 1994 [DE] Germany .................. 44 02 122.4

[51] Int. Cl.$^6$ .................................................. G06F 11/00
[52] U.S. Cl. ................................................. 371/21.2
[58] Field of Search ........................ 371/21.2, 21.5, 371/21.6, 72

[56] References Cited

U.S. PATENT DOCUMENTS 4,061,908  12/1977  de Jonge et al. ............... 235/302.3

OTHER PUBLICATIONS

"Method for Address Fault Detection", IBM Technical Disclosure Bulletin, vol. 32, No. 1, Jun. 1989, New York.

"Nonvolatile Ram Failure Rate Detection Through the Use of Redundancy", IBM Technical Disclosure Bulletin, vol. 31, No. 10, Mar. 1989, New York.

*Primary Examiner*—Vincent P. Canney
*Attorney, Agent, or Firm*—Kenyon & Kenyon

[57] ABSTRACT

A method for testing a digital memory device, wherein the value ADR(1 ... DN-1) XOR ADR(D ... N) is entered into each memory cell of the memory device such that the sequence of numerical values entered depends on the address field (address bits D ... N), and addressing errors in the higher-order address lines are detected.

1 Claim, 1 Drawing Sheet

|  | A2 | A1 | A1 XOR A2 | ERROR (A4 = 0) |
|---|---|---|---|---|
| 1 | 00 | 00 | 00 | 10 |
| 2 | 00 | 01 | 01 | 11 |
| 3 | 00 | 10 | 10 | 00 |
| 4 | 00 | 11 | 11 | 01 |
| 5 | 01 | 00 | 01 | 11 |
| 6 | 01 | 01 | 00 | 10 |
| 7 | 01 | 10 | 11 | 01 |
| 8 | 01 | 11 | 10 | 00 |
| 9 | 10 | 00 | 10 | 10 |
| 10 | 10 | 01 | 11 | 11 |
| 11 | 10 | 10 | 00 | 00 |
| 12 | 10 | 11 | 01 | 01 |
| 13 | 11 | 00 | 11 | 11 |
| 14 | 11 | 01 | 10 | 10 |
| 15 | 11 | 10 | 01 | 01 |
| 16 | 11 | 11 | 00 | 00 |

METHOD FOR TESTING DIGITAL MEMORY DEVICES

The invention concerns a method for testing digital memory devices, in which

A certain number is assigned to each memory cell of the digital memory device, the quantity of selectable numerical values being defined by the number of memory cell locations, and the assignment of the numerical values occurring in such a way that a conclusion as to the address of the memory cells can be drawn from a numerical sequence from a plurality of memory cells succeeding one another in the address field;

The respective numerical values assigned to the memory cells of the digital memory device are written to them;

The memory cells are read and the read-out numerical value is compared with the respective assigned numerical value; and If the read-out numerical value and the assigned numerical value are not identical, an error message is generated.

A method of this kind is known from IMB TECHNICAL DISCLOSURE BULLETIN Vol. 32, No. 1, June 1989, New York, USA, page 220: "Method for address fault detection." In this method, two numbers are used to check a memory with four 1-bit wide memory cells; one of the numbers 0 or 1 is assigned to each memory cell, and from the sequence of assigned numbers of a plurality of memory cells succeeding one another in the address field, a conclusion can be drawn as to the address of the memory cell. The assigned numbers are written into the respective memory cell, all four memory cells of the overall memory being written to in succession, beginning with the memory cell with the lowest address up to the memory cell with the highest address. The memory cells are then read out, and the memory contents compared with the respective assigned number. A difference between the read-out memory contents and the assigned number may be attributed to an addressing or memorization error. The assigned numbers are then stored again, this time beginning with the highest address. The memory cells are then read out again, and the memory contents compared with the assigned number to check identity.

In another known method, the digital memory device test occurs in such a way that the address of each memory cell is written into that cell, and then the memory is read out again. Any errors which occur can be detected by comparing the respective stored address with the read-out memory contents, which must correspond to that address. Because of the high memory capacity of many circuits, this is a complex procedure.

In printed circuit boards, the most common embodiment of modern circuits, short circuits occur particularly often between adjacent conductor paths. In the case of memories arranged on circuit boards, this often causes addressing errors to occur, i.e. the data are written into incorrect memory cells or multiple accesses occur to individual memory cells under various addresses. Addressing errors of this kind are not always detectable with the memory test just cited.

It is the object of the invention to indicate a method with which, in digital memory devices with memory cells comprising a plurality of address bits, the aforesaid addressing errors can be recognized. According to the invention this is done, in a method of the aforesaid kind, by the fact that in a digital memory device with memory cells each comprising four address bits, the assignment of the numerical values to the memory cells occurs as defined by $$Z = ADR(0, 1, \ldots S1) \text{ XOR } ADR(S, \ldots N),$$

where $Z$=Numerical value in binary notation;

$ADR$=Address of the memory cell in binary notation;

$N$=Number of address bits in the memory cell minus one; and $S$=2(location number of the memory location).

The invention will be explained in more detail with reference to two Figures, which show by way of example:

in FIG. 1, an ordinary electronic circuit; and in FIG. 2, the coding of test data.

The electronic circuit depicted in FIG. 1 comprises a memory 1 and a microprocessor 2. The connection between the two functional groups is constituted by a bus system consisting of an address bus A with four data lines and a data bus D with two data lines.

The two data lines correspond to the width of one two-bit memory location. The entire memory possesses $2^4 = 16$ different memory cells. It not possible to unequivocally code these 16 different memory cells with only the two data lines with a total of four displayable states.

In conventional test methods, therefore, only a portion of the address information is written into the memory cells, for example the two lowest-order address bits. With this test method, however, addressing errors that occur because of a short circuit of the top two address lines are not detected, because for example memory cells 1, 5, 9, and 13 contain the same information, and the effect of an addressing error of this kind is such that instead of memory cell 1, for example memory cell 5 or 9 is written to.

According to the invention, the pure address information is not written into the memory cells, but rather the address information for the two lower-order address lines is linked to the address information for the two higher-order address lines. This occurs, for example, by means of the logical operation A1 XOR A2. The result of this operation is depicted in FIG. 2. As is evident from FIG. 2, the sequence of numerical values for addresses 1–4 and 5–8 etc. is different. A conclusion can therefore be drawn from this different sequence as to the location of the memory cell in the overall address space. This also makes it possible, however, to detect errors of the kind described above. For example, when a short circuit of the topmost address line exists, during the memory test the information for cells 13–16 is written to the location of cells 5–8. The original information in these cells is therefore overwritten. When the memory is read out, what results is therefore the picture indicated in FIG. 2 in the "Error" column. The sequence of read-out data is thus identical for memory cells 1–8 and 9–16. This is an unequivocal indication that the fourth address line is defective. Troubleshooting is therefore considerably facilitated.

What is claimed is:

1. A method for testing a digital memory device, the digital memory device including a first quantity of memory cells, each of the memory cells having a distinct address, the method comprising the steps of:

defining a second quantity of predetermined values as a function of the first quantity of memory cells;

assigning the predetermined values to each of the respective memory cells, the predetermined values being assigned so as to determine the distinct address of each of the respective memory cells from a numerical sequence of the distinct address of successive ones of the respective memory cells;

writing the predetermined values to each of the respective memory cells;

reading-out stored values from each of the respective memory cells;

comparing each of the stored values read out with each corresponding one of the predetermined values; and generating an error message when one of the stored values read-out is different from the corresponding one of the predetermined values, wherein each of the memory cells includes at least four address bits and the predetermined values are assigned to the memory cells as follows:

$$Z = ADR(0,1, \ldots S1) \text{ XOR } ADR(S, \ldots N),$$

where:

Z=an assigned numerical value,

ADR=the address of one of the memory cells,

N=the number of address bits in each of the memory cells minus one,

S=a location number of a memory location, the location number having a value of 2.

\* \* \* \* \*